United States Patent
Koo

(10) Patent No.: US 8,207,771 B2
(45) Date of Patent: Jun. 26, 2012

(54) DUTY CYCLE CORRECTING CIRCUIT AND DUTY CYCLE CORRECTING METHOD

(75) Inventor: Cheul-Hee Koo, Gyeonggi-do (KR)

(73) Assignee: Hynix Semiconductor Inc., Gyeonggi-do (KR)

(*) Notice: Subject to any disclaimer, the term of this patent is extended or adjusted under 35 U.S.C. 154(b) by 0 days.

(21) Appl. No.: 12/687,985

(22) Filed: Jan. 15, 2010

(65) Prior Publication Data

US 2011/0227623 A1    Sep. 22, 2011

Related U.S. Application Data

(62) Division of application No. 11/878,570, filed on Jul. 25, 2007, now Pat. No. 7,675,337.

(30) Foreign Application Priority Data

Feb. 12, 2007  (KR) .......................... 10-2007-0014241

(51) Int. Cl.
*H03K 3/017* (2006.01)
*H03K 5/04* (2006.01)
*H03K 7/08* (2006.01)

(52) U.S. Cl. .......................... 327/175; 327/173; 327/174

(58) Field of Classification Search ........... 327/172–176
See application file for complete search history.

(56) References Cited

U.S. PATENT DOCUMENTS

| | | | |
|---|---|---|---|
| 6,801,068 B2 | 10/2004 | Yin | |
| 6,853,225 B2 | 2/2005 | Lee | |
| 6,859,081 B2 | 2/2005 | Hong et al. | |
| 6,963,235 B2 | 11/2005 | Lee | |
| 6,992,515 B1 | 1/2006 | Birrittella | |
| 7,612,592 B2* | 11/2009 | Parikh | 327/175 |
| 7,633,324 B2* | 12/2009 | Yun et al. | 327/160 |
| 7,675,337 B2* | 3/2010 | Koo | 327/175 |
| 2004/0066873 A1 | 4/2004 | Cho et al. | |
| 2006/0197565 A1 | 9/2006 | Kang | |
| 2007/0146029 A1 | 6/2007 | Parikh | |
| 2008/0164922 A1 | 7/2008 | Yun et al. | |
| 2008/0191757 A1 | 8/2008 | Choi | |

FOREIGN PATENT DOCUMENTS

JP    2004129255    4/2004
KR    1020030084487    11/2003

* cited by examiner

*Primary Examiner* — Patrick O'Neill
(74) *Attorney, Agent, or Firm* — Venable LLP; Jeffri A. Kaminski

(57) ABSTRACT

A duty cycle correcting circuit includes a first duty ratio correcting unit that widens a high-level period of an input clock in response to a detection signal, thereby correcting a duty ratio of the input clock to output a first corrected clock. A second duty ratio correcting unit narrows the high-level period of the input clock in response to the detection signal, thereby correcting the duty ratio of the input clock to output a second corrected clock. A clock selecting unit selectively outputs the first corrected clock or the second corrected clock as an output clock in response to the detection signal. A duty ratio detecting unit detects a duty ratio of the output clock, thereby generating the detection signal.

32 Claims, 10 Drawing Sheets

20,1,2 # DUTY CYCLE CORRECTING CIRCUIT AND DUTY CYCLE CORRECTING METHOD

CROSS-REFERENCE TO RELATED PATENT APPLICATION

This application is a divisional of U.S. patent application Ser. No. 11/878,570, filed Jul. 25, 2007, which claims benefit of Korean Patent Application No. 10-2007-0014241, filed on Feb. 12, 2007, in the Korean Intellectual Property Office, the subject matter of which application is incorporated herein by reference in its entirety.

BACKGROUND OF THE INVENTION

1. Technical Field

Embodiments of the present invention relate to a duty cycle correcting circuit and a duty cycle correcting method, and more particularly, to a digital-type duty cycle correcting circuit and a duty cycle correcting method that may be capable of generating a clock having an improved duty ratio quality.

2. Related Art

In general, a DLL (Delay Locked Loop) circuit is included in a semiconductor integrated circuit. The DLL circuit makes a phase of an internal clock earlier than a phase of an external clock by a predetermined time to compensate for a delay time due to internal delay elements until the internal clock can synchronize with the data. Therefore, output data is not delayed more than the external clock. The internal clock is used to control a data output buffer.

In the internal clock that is generated by the DLL circuit, it is difficult to accurately make a duty ratio 50:50. Therefore, the DLL circuit includes a duty cycle correcting circuit to adjust the duty ratio of the internal clock. Examples of the duty cycle correcting circuit include an analog-type duty cycle correcting circuit and a digital-type duty cycle correcting circuit. In general, the analog-type duty cycle correcting circuit is superior to the digital-type duty cycle correcting circuit, and the analog-type duty cycle correcting circuit generates a clock having better duty ratio quality. However, the analog-typed duty cycle correcting circuit has disadvantages in that it takes a large amount of time to perform a duty cycle correcting operation, occupies a large area and consumes a large amount of current. Meanwhile, the digital-type duty cycle correcting circuit has advantages in that it has a relatively short operation time, occupies a small area, and consumes a small amount of current, but has a disadvantage in that it has a clock duty ratio correcting function inferior to the analog-type duty ratio correcting circuit.

As a semiconductor integrated circuit operates at a high speed, is highly integrated, and consumes low power, it is preferable to implement the digital-type duty cycle correcting circuit that generates a clock having an improved duty ratio quality. However, there exist technical limits in implementing the digital-type duty cycle correcting circuit having the more improved operation ability.

SUMMARY

Embodiments of the present invention provide a digital-type duty cycle correcting circuit and a duty cycle correcting method that are capable of outputting a clock having an improved duty ratio quality.

An embodiment of the present invention provides a duty cycle correcting circuit that including: a first duty ratio correcting unit configured to widen a high-level period of an input clock in response to a detection signal, thereby correcting a duty ratio of the input clock to output a first corrected clock; a second duty ratio correcting unit configured to narrow the high-level period of the input clock in response to the detection signal, thereby correcting the duty ratio of the input clock to output a second corrected clock; a clock selecting unit configured to selectively output the first corrected clock or the second corrected clock as an output clock in response to the detection signal; and a duty ratio detecting unit configured to detect a duty ratio of the output clock, thereby generating the detection signal.

Another embodiment of the present invention provides a duty cycle correcting circuit including: a first duty ratio correcting unit configured to perform, when a high-level period of an input clock is narrower than a low-level period thereof, a logical sum operation on the input clock and a signal obtained by delaying the input clock to generate a first corrected clock; a second duty ratio correcting unit configured to perform, when the high-level period of the input clock is wider than the low-level period thereof, a logical product operation on the input clock and the signal obtained by delaying the input clock to generate a second corrected clock; and a clock selecting unit configured to selectively output the first corrected clock or the second corrected clock as an output clock in accordance with a duty ratio of the output clock.

Still another embodiment of the present invention provides a duty cycle correcting circuit including: a first duty ratio correcting unit configured to widen a high-level period of an input clock in response to a detection signal, thereby correcting a duty ratio of the input clock to output a corrected clock; a second duty ratio correcting unit configured to narrow a high-level period of the corrected clock in response to the detection signal, thereby correcting a duty ratio of the corrected clock to output an output clock; and a duty ratio detecting unit configured to detect a duty ratio of the output clock, thereby generating the detection signal.

Yet another embodiment of the present invention provides a duty cycle correcting circuit including: a first duty ratio correcting unit configured to narrow a high-level period of an input clock in response to a detection signal, thereby correcting a duty ratio of the input clock to output a corrected clock; a second duty ratio correcting unit configured to widen a high-level period of the corrected clock in response to the detection signal, thereby correcting a duty ratio of the corrected clock to output an output clock; and a duty ratio detecting unit configured to detect a duty ratio of the output clock, thereby generating the detection signal.

A further embodiment of the present invention provides a duty cycle correcting method including: widening a high-level period of an input clock in response to a detection signal, thereby correcting a duty ratio of the input clock to output a first corrected clock; narrowing the high-level period of the input clock in response to the detection signal, thereby correcting the duty ratio of the input clock to output a second corrected clock; selectively outputting the first corrected clock or the second corrected clock as an output clock in response to the detection signal; and detecting a duty ratio of the output clock, thereby generating the detection signal.

A further embodiment of the present invention provides a duty cycle correcting method including: performing, when a high-level period of an input clock is narrower than a low-level period thereof, a logical sum operation on the input clock and a signal obtained by delaying the input clock to generate a corrected clock; performing, when the high-level period of the input clock is wider than the low-level period thereof, a logical product operation on the corrected clock and a signal obtained by delaying the corrected clock to generate an output clock, and selectively activating the generating of the corrected clock or the generating of the output clock in accordance with a duty ratio of the output clock.

A further embodiment of the present invention provides a duty cycle correcting method including: performing, when a high-level period of an input clock is wider than a low-level period thereof, a logical product operation on the input clock and a signal obtained by delaying the input clock to generate a corrected clock; performing, when the high-level period of the input clock is narrower than the low-level period thereof, a logical sum operation on the corrected clock and a signal obtained by delaying the corrected clock to generate an output clock, and selectively activating the generating of the corrected clock or the generating of the output clock in accordance with a duty ratio of the output clock.

DESCRIPTION OF EXEMPLARY EMBODIMENT

Embodiments of the present invention will now be described in detail with reference to the accompanying drawings.

Figure 1:
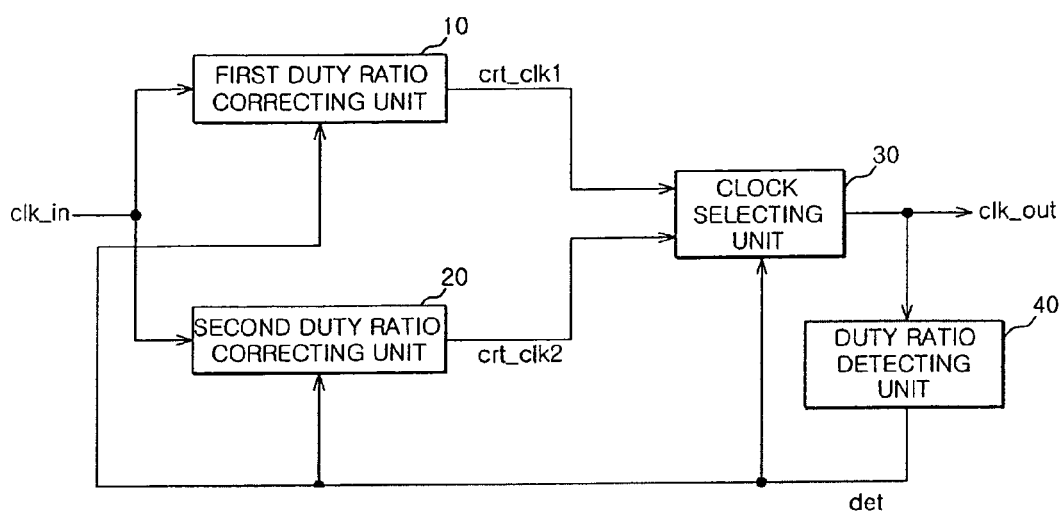
FIG. 1 is a block diagram illustrating an exemplary structure of an exemplary duty cycle correcting circuit according to an embodiment of the present invention.

Referring to FIG. 1, an exemplary duty cycle correcting circuit includes a first duty ratio correcting unit 10, a second duty ratio correcting unit 20, a clock selecting unit 30, and a duty ratio detecting unit 40.

The first duty ratio correcting unit 10 widens a high-level period of an input clock clk_in in response to a detection signal det, thereby correcting a duty ratio of the input clock clk_in to output a first corrected clock crt_clk1.

The second duty ratio correcting unit 20 narrows the high-level period of the input clock clk_in in response to the detection signal det, thereby correcting the duty ratio of the input clock clk_in to output a second corrected clock crt_clk2.

The clock selecting device 30 selectively outputs the first corrected clock crt_clk1 or the second corrected clock crt_clk2 as an output clock clk_out in response to the detection signal det.

The duty ratio detecting unit 40 detects a duty ratio of the output clock clk_out, thereby generating the detection signal det.

The duty ratio detecting unit 40 generates the detection signal det that includes information on the duty ratio of the output clock clk_out. For example, when the detection signal det is at a high level, the first duty ratio correcting unit 10 determines that a high-level period of the output clock clk_out is narrower than a low-level period, and widens the high-level period of the input clock clk_in to generate the first corrected clock crt_clk1. At this time, the second duty ratio correcting unit 20 is not activated.

Meanwhile, when the detection signal det is at a low level, the second duty ratio correcting unit 20 determines that the high-level period of the output clock clk_out is wider than the low-level period, and narrows the high-level period of the input clock clk_in to generate the second corrected clock crt_clk2. At this time, the first duty ratio correcting unit 10 is not activated.

The clock selecting unit 30 obtains information on the duty ratio of the output clock clk_out from the detection signal det. When the first duty ratio correcting unit 10 is activated, the clock selecting unit 30 outputs the first corrected clock crt_clk1 as the output clock clk_out. When the second duty ratio correcting unit 20 is activated, the clock selecting unit 30 output the second corrected clock crt_clk2 as the output clock clk_out.

Figure 2:
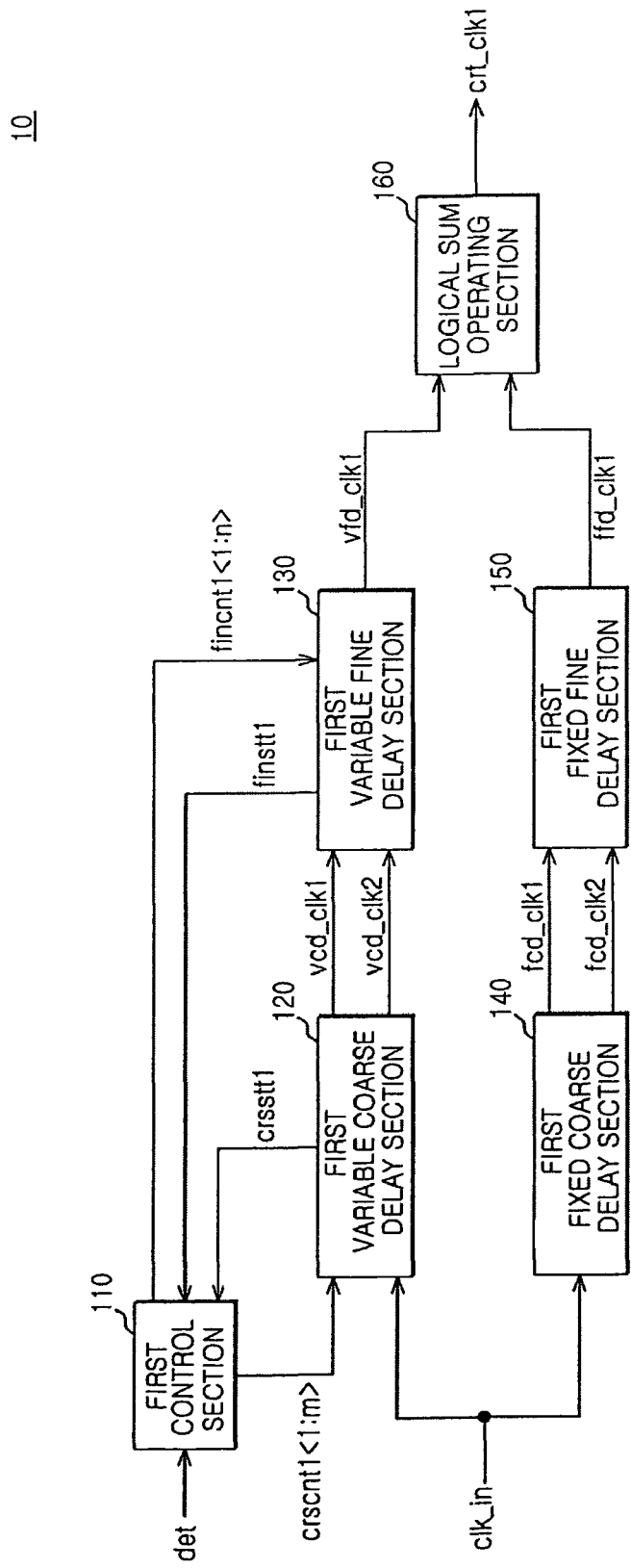
FIG. 2 is a diagram illustrating detailed structure of an exemplary first duty ratio correcting unit shown in FIG. 1.

Referring to FIG. 2, the first duty ratio correcting unit 10 includes a first control section 110, a first variable coarse delay section 120, a first variable fine delay section 130, a first fixed coarse delay section 140, a first fixed fine delay section 150, and a logical sum operating section 160.

The first control section 110 receives the detection signal det, and generate m first coarse control signals crscnt1<1:m> and n first fine control signals fincnt1<1:n> in response to a first coarse state signal crsstt1 and a first fine state signal finstt1.

The first variable coarse delay section 120 coarsely delays the input clock clk_in in response to the m first coarse control signals crscnt1<1:m> to output a first variable coarse delay clock vcd_clk1 and a second variable coarse delay clock vcd_clk2, and outputs the first coarse state signal crsstt1.

The first variable fine delay section 130 outputs a first variable fine delay clock vfd_clk1 from the first variable coarse delay clock vcd_clk1 and the second variable coarse delay clock vcd_clk2 in response to the n first fine control signals fincnt1<1:n>, and outputs the first fine state signal finstt1.

The first fixed coarse delay section 140 coarsely delays the input clock clk_in by a fixed value, thereby outputting a first fixed coarse delay clock fcd_clk1 and a second fixed coarse delay clock fcd_clk2.

The first fixed fine delay section 150 outputs a first fixed fine delay clock ffd_clk1 from the first fixed coarse delay clock fcd_clk1 and the second fixed coarse delay clock fcd_clk2.

The logical sum operating section 160 performs a logical sum operation on the first variable fine delay clock vfd_clk1 and the first fixed fine delay clock ffd_clk1, thereby outputting the first corrected clock crt_clk1.

The first coarse state signal crsstt1 defines the limit of the delay amount which the first variable coarse delay section 120 provides to the input clock clk_in. The first fine state signal finstt1 defines the limit of the delay amount which the first variable fine delay section 130 provides to the first variable coarse delay clock vcd_clk1 and the second variable coarse delay clock vcd_clk2. That is, the first control section 110 instructs the delay units to delay the input clock clk_in until the first coarse state signal crsstt1 and the first fine state signal finstt1 are enabled. In the first coarse state signal crsstt1 and the first fine state signal finstt1, the delay limits by the first variable coarse delay unit 120 and the first variable fine delay unit 130 are set in advance to cause the duty ratio of the first corrected clock crt_clk1 to be at 50%.

During an initial operation of the first duty ratio correcting unit 10, the first variable coarse delay section 120 and the first fixed coarse delay section 140 have the same delay value. The timing difference that corresponds to one unit delayer is generated between the first variable coarse delay clock vcd_clk1 and the second variable coarse delay clock vcd_clk2. Also, the timing difference that corresponds to one unit delayer is generated between the first fixed coarse delay clock fcd_clk1 and the second fixed coarse delay clock fcd_clk2. The first variable fine delay section 130 and the first fixed fine delay section 150 have the same delay value with each other. Therefore, the first variable fine delay clock vfd_clk1 and the first fixed fine delay clock ffd_clk1 toggle at the same timing.

Then, when the first duty ratio correcting unit 10 operates and the detection signal det becomes a high level, the first variable coarse delay section 120 delays the input clock clk_in by a predetermined delay time in response to the m first coarse control signals crscnt1<1:m> to generate the first variable coarse delay clock vcd_clk1 and the second variable coarse delay clock vcd_clk2. Subsequently, the first variable fine delay section 130 generates the first variable fine delay clock vfd_clk1 from the first variable coarse delay clock vcd_clk1 and the second variable coarse delay clock vcd_clk2 in response to the n first fine control signals fincnt1<1:n>. Accordingly, the first variable fine delay clock vfd_clk1 is delayed more than the first fixed fine delay clock ffd_clk1. The logic sum operating section 160 performs a logical sum operation on the first variable fine delay clock vfd_clk1 and the first fixed fine delay clock ffd_clk1, thereby generating the first corrected clock crt_clk1 that has a high-level period wider than that of the input clock clk_in.

Figure 3:
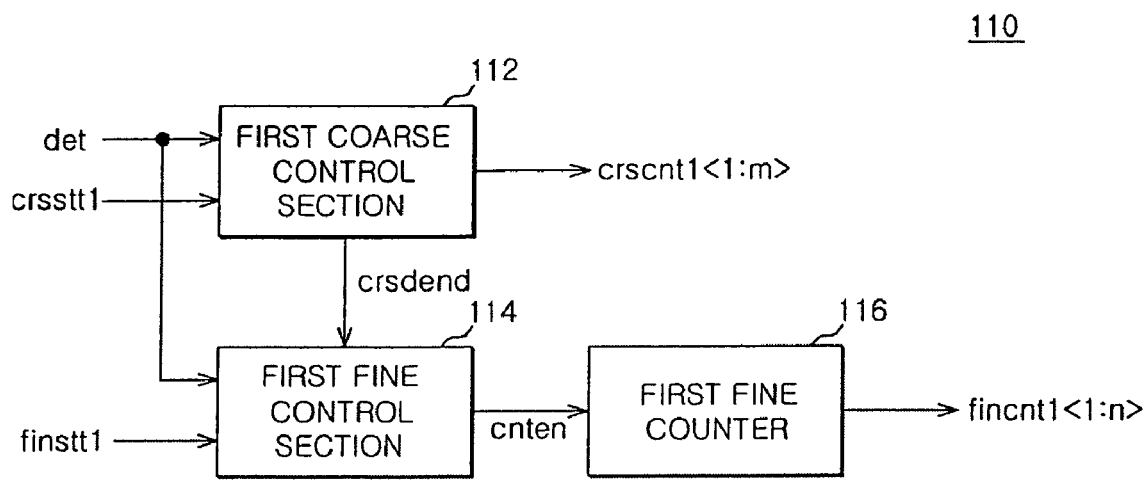
FIG. 3 is a diagram illustrating a detailed structure of an exemplary first control section shown in FIG. 2.

Referring to FIG. 3, an exemplary first control section 110 includes a first coarse control section 112, a first fine control section 114, and a first fine counter 116.

The first coarse control section 112 generates a coarse delay completion signal crsdend and the m first coarse control signals crscnt1<1:m> in response to the detection signal det and the first coarse state signal crsstt1.

The first fine control section 114 generates a count enable signal cnten in response to the detection signal det, the coarse delay completion signal crsdend, and the first fine state signal finstt1.

The first fine counter 116 generates the n first fine control signals fincnt1<1:n> in response to the count enable signal cnten.

When the detection signal det is at a high level, the first coarse control section 112 generates the m first coarse control signals crscnt1<1:m>. The m first coarse control signals crscnt1<1:m> are transmitted to the first variable coarse delay section 120 and increase, for example, sequentially, the delay amount of the input clock clk_in. Then, when the first coarse state signal crsstt1 is enabled, the first coarse control section 112 fixes logic values of the m first coarse control signals crscnt1<1:m> and enables the coarse delay completion signal crsdend.

When the detection signal det is still at a high level, the first fine control section 114 enables the count enable signal cnten if the coarse delay completion signal crsdend is enabled. As the count enable signal cnten is enabled, the first fine counter 116 changes the logic values of the n first fine control signals fincnt1<1:n>, thereby controlling the delay amounts which the first variable fine delay section 130 provides to the first variable coarse delay clock vcd_clk1 and the second variable coarse delay clock vcd_clk2. Then, when the first fine state signal finstt1 is enabled, the first fine control section 114 disables the count enable signal cnten. Therefore, the logic values of the n first fine control signals fincnt1<1:n> are fixed.

As described in the example above, the detection signal det is a signal whose level is determined according to the duty ratio of the output clock clk_out. The first control section 110 stops the above-described operations when the duty ratio of the output clock clk_out is changed and thus the level of the detection signal det is changed to a low level.

Figure 4A:
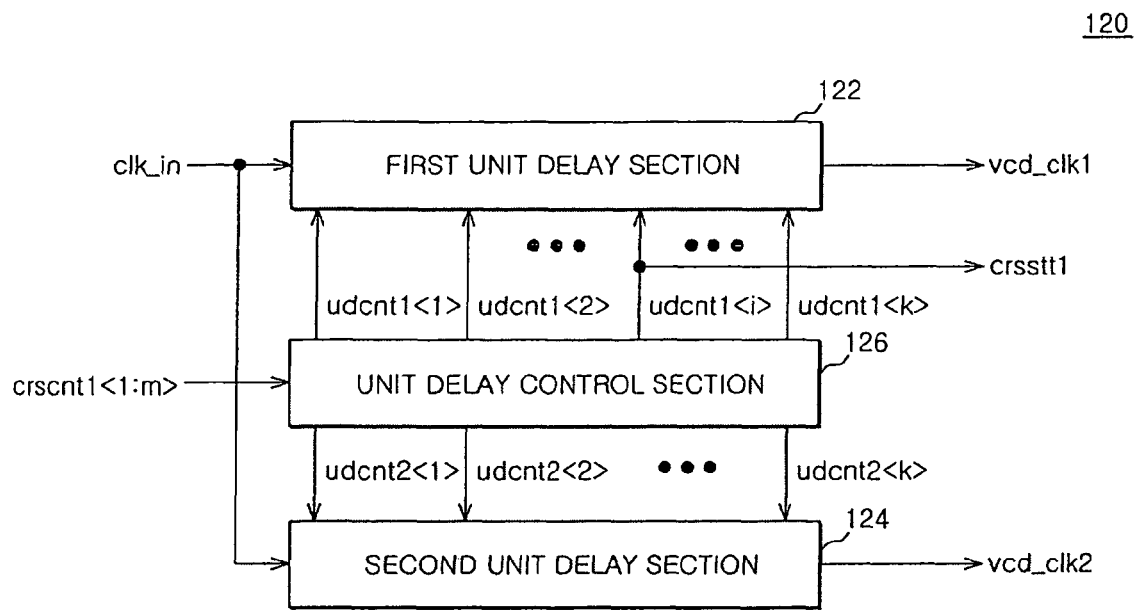
FIG. 4A is a diagram illustrating a detailed structure of an exemplary variable coarse delay section shown in FIG. 2.

Referring to FIG. 4A, the exemplary first variable coarse delay section 120 includes a first unit delay section 122, a second unit delay section 124, and a unit delay control section 126.

The first unit delay section 122 delays the input clock clk_in in response to k first unit delay control signals udcnt1<1:k>, thereby outputting the first variable coarse delay clock vcd_clk1.

The second unit delay section 124 delays the input clock clk_in in response to k second unit delay control signals udcnt2<1:k>, thereby outputting the second variable coarse delay clock vcd_clk2.

The unit delay control section 126 enables any one of the k first unit delay control signals udcnt1<1:k> and any one of the k second unit delay control signals udcnt2<1:k> in response to the m first coarse control signals crscnt1<1:m>.

Each of the first unit delay section 122 and the second unit delay section 124 includes a plurality of unit delayers. The first unit delay section 122 and the second unit delay section 124 provide the delay times to the input clock clk_in in response to the k first unit delay control signals udent1<1:k> and the k second unit delay control signals udcnt2<1:k>, thereby outputting the first variable coarse delay clock vcd_clk1 and the second variable coarse delay clock vcd_clk2. At this time, the k first unit delay control signals udent1<1:k> and the k second unit delay control signals udcnt2<1:k> have values in which the timing difference that corresponds to a delay time by one unit delayer is generated between the first variable coarse delay clock vcd_clk1 and the second variable coarse delay clock vcd_clk2.

The unit delay control section 126 enables any one of the k first unit delay control signals udcnt1<1:k> and any one of the k second unit delay control signals udcnt2<1:k> in response to the m first coarse control signals crscnt1<1:m>. Among the k first unit delay control signals udcnt1<1:k> and the k second unit delay control signals udcnt2<1:k>, if signals, which are input to unit delayers that are closer to an input terminal of the input clock clk_in, are enabled, a large amount of delay time is provided to the input clocks clk_in.

One of the k first unit delay control signals udcnt1<1:k> and the k second unit delay control signals udcnt2<1:k> is set as the first coarse state signal crsstt1. The first coarse state signal crsstt1 informs the first control section 110 of whether the first variable coarse delay section 120 delays the input clock clk_in for the delay time corresponding to the limit of the delay time provided to the input clock clk_in. In this case, the i-th first unit delay control signal udcnt1<i> is set as the first coarse state signal crsstt1.

Figure 4B:
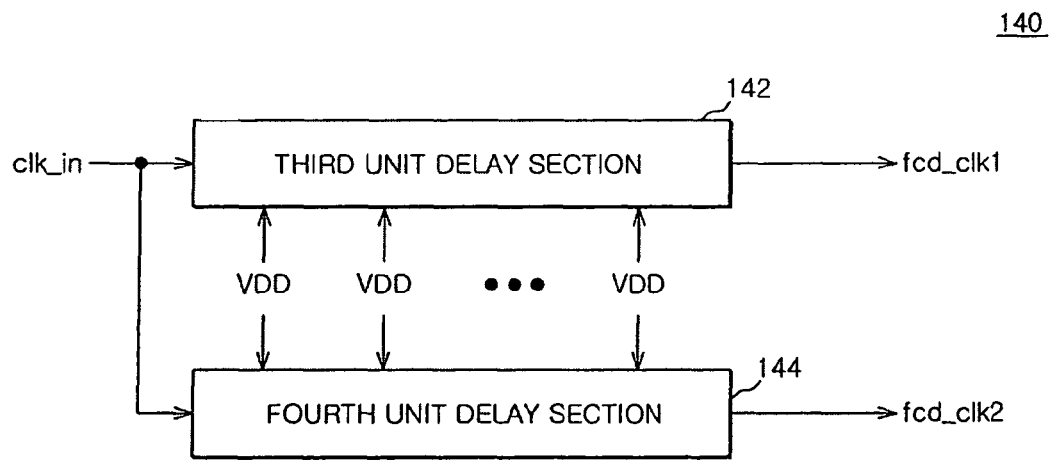
FIG. 4B is a diagram illustrating a detailed structure of an exemplary first fixed coarse delay section shown in FIG. 2.

Referring to FIG. 4B, the first fixed coarse delay unit 140 includes a third unit delay section 142 and a fourth unit delay section 144.

The third unit delay section 142 delays the input clock clk_in for a predetermined time, thereby outputting the first fixed coarse delay clock fcd_clk1.

The fourth unit delay section 144 delays the input clock clk_in for a predetermined time, thereby outputting the second fixed coarse delay clock fcd_clk2.

Unlike the first variable coarse delay section 120, each unit delayer, which is included in each of the third unit delay section 142 and the fourth unit delay section 144 of the first fixed coarse delay section 140, is supplied with an external power supply voltage VDD instead of a unit delay control signal. Therefore, each of the third unit delay section 142 and the fourth unit delay section 144 provides a fixed delay time to the input clock clk_in. As a result, the first fixed coarse delay clock fcd_clk1 and the second fixed coarse delay clock fcd_clk2 have a timing difference that corresponds to the delay time by one unit delayer.

Figure 5A:
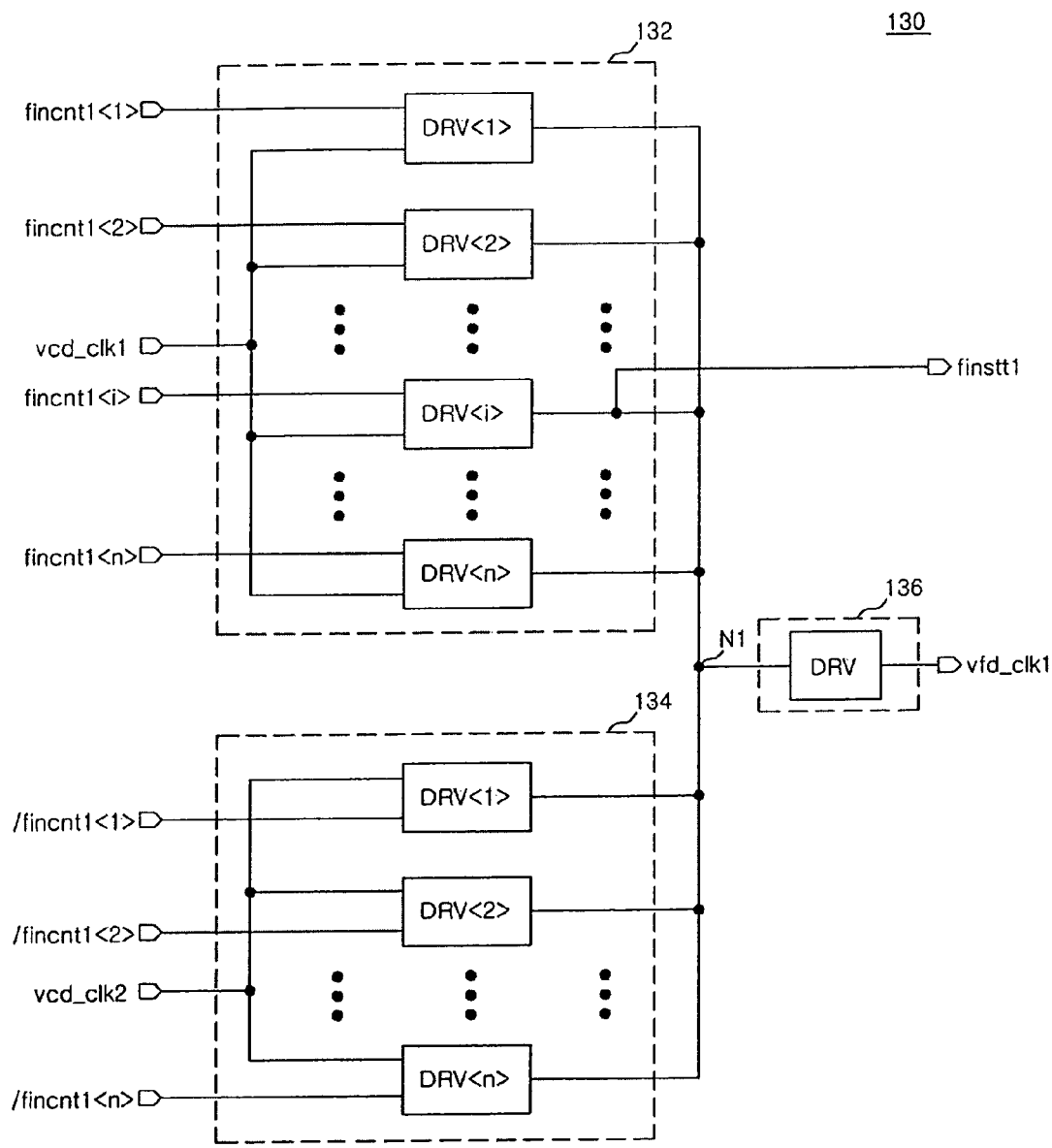
FIG. 5A is a diagram illustrating a detailed structure of an exemplary first variable fine delay section shown in FIG. 2.

Referring to FIG. 5A, the exemplary first variable fine delay section 130 includes a first driving section 132, a second driving section 134, and a third driving section 136.

The first driving section 132 drives the first variable coarse delay clock vcd_clk1 in response to the n first fine control signals fincnt1<1:n> and transmits the driven first variable coarse delay clock vcd_clk1 to a first node N1.

The second driving section 134 drives the second variable coarse delay clock vcd_clk2 in response to inverted signals /fincnt1<1:n> of the n first fine control signals and transmits the driven second variable coarse delay clock vcd_clk2 to the first node N1.

The third driving section 136 drives the signal applied to the first node N1, thereby outputting the first variable fine delay clock vfd_clk1.

The first driving section 132 includes n drivers DRV<1:n> of which input terminals receive the first variable coarse delay clock vcd_clk1 and of which control terminals receive signals included in the n first fine control signals fincnt1<1:n>, respectively.

The second driving section 134 includes n drivers DRV<1:n> of which input terminals receive the second variable coarse delay clock vcd_clk2 and of which control terminals receive signals included in the inverted signals /fincnt1<1:n> of the n first fine control signals, respectively.

The third driving section 136 includes one driver DRV that drives the signal applied to the first node N1.

During an initial operation of the first variable fine delay section 130, all of the n first fine control signals fincnt1<1:n> become a high level and all of the inverted signals /fincnt1<1:n> of the n first fine control signals become a low level. Therefore, the n drivers DRV<1:n> of the first driving section 132 are activated, and thus the first variable coarse delay clock vcd_clk1 is driven and transmitted to the first node N1. At this time, since the n drivers DRV<1:n> of the second driving section 134 are not activated, the second variable coarse delay clock vcd_clk2 is not driven.

Then, if the first variable fine delay section 130 performs a delay operation in response to the n first fine control signals fincnt1<1:n>, the number of high-level signals that are included in the n first fine control signals fincnt1<1:n> is gradually decreased. For this reason, the driving force of each of the first driving section 132 and the second driving section 134 is changed. Accordingly, a toggle timing of the signal that is transmitted to the first node N1 is changed, and thus the timing of the first variable fine delay clock vfd_clk1 is changed.

One of the output signal of the first driving section 132 and the output signal of the second driving section 134 is used as the first fine state signal finstt1. In order to inform the first control section 110 of whether the toggle timing of the first variable fine delay clock vfd_clk1 output from the first variable fine delay section 130 is delayed by a predetermined delay amount, a state change of a predetermined one of the n drivers DRV<1:n> of the first driving section 132 and the n drivers DRV<1:n> of the second driving section 134 is used. Here, an example where the i-th driver DRV<i> of the first driving section 132 is used is described.

Figure 5B:
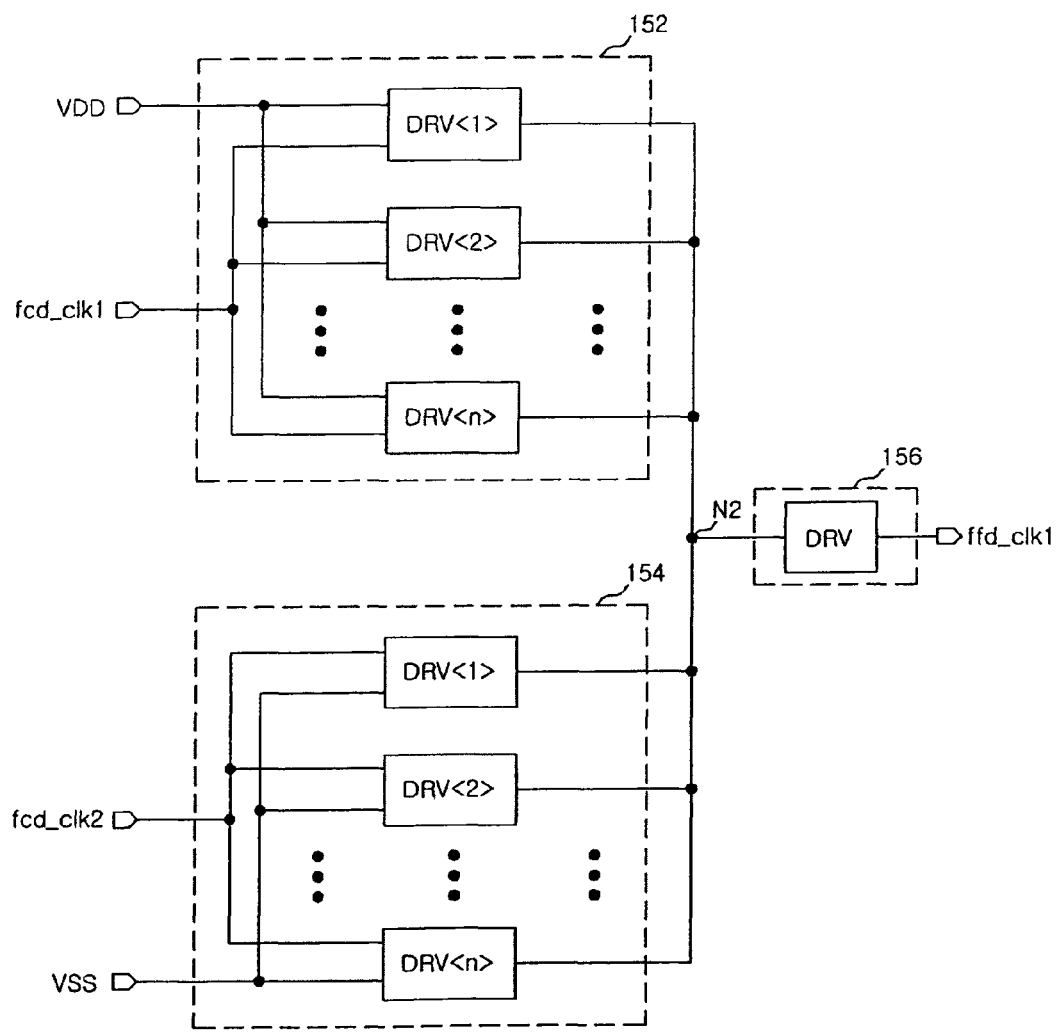
FIG. 5B is a diagram illustrating a detailed structure of an exemplary first fixed fine delay section shown in FIG. 2.

Referring to FIG. 5B, the exemplary first fixed fine delay section 150 includes a fourth driving section 152, a fifth driving section 154, and a sixth driving section 156.

The fourth driving section 152 drives the first fixed coarse delay clock fcd_clk1 and transmit the driven first fixed coarse delay clock fcd_clk1 to a second node N2 according to the control of the external power supply voltage VDD.

The fifth driving section 154 drives the second fixed coarse delay clock fcd_clk2 and transmits the driven second fixed coarse delay clock fcd_clk2 to the second node N2 according to the control of a ground voltage VSS.

The sixth driving section 156 drives a signal applied to the second node N2, thereby outputting the first fixed fine delay clock ffd_clk1.

Similar to the first variable fine delay section 130, in the first fixed fine delay section 150, the fourth driving section 152 includes n drivers DRV<1:n>, the fifth driving section 154 includes n drivers DRV<1:n>, and the sixth driving section 156 includes one driver DRV.

Since control terminals of the n drivers DRV<1:n> of the fourth driving section 152 are supplied with the external power supply voltage VDD, all of the n drivers DRV<1:n> of the fourth driving section 152 are activated. Since control terminals of the n drivers DRV<1:n> of the fifth driving section 154 are supplied with the ground voltage VSS, all of the N drivers DRV<1:n> of the fifth driving section 154 are inactivated. Therefore, the first fixed fine delay clock ffd_clk1 is obtained by delaying the first fixed coarse delay clock fcd_clk1 by a predetermined fixed delay time.

Figure 6:
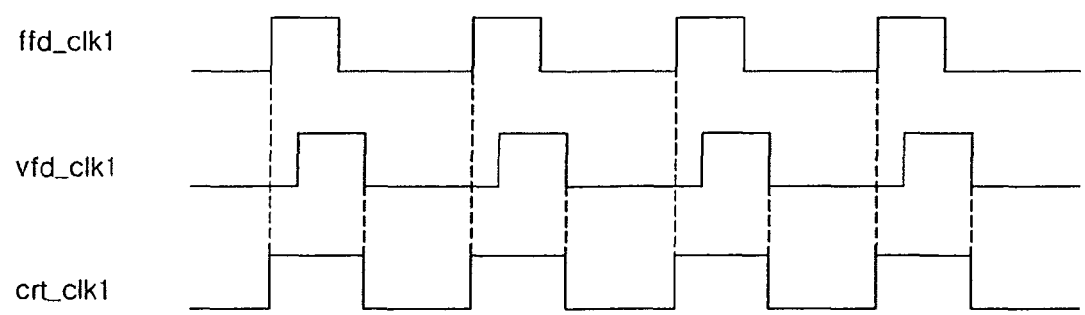
FIG. 6 is a timing diagram illustrating the an example of operation of an exemplary first duty ratio correcting unit shown in FIG. 2.

FIG. 6 shows exemplary waveforms of a first fixed fine delay clock ffd_clk1, a first variable fine delay clock vfd_clk1, and a first corrected clock crt_clk1 when a first duty ratio correcting unit 10 is activated.

The first duty ratio correcting unit 10 is activated when a high-level period of the input clock clk_in is narrower than a low-level period thereof. The first variable fine delay clock vfd_clk1, which is generated by the first variable coarse delay section 120 and the first variable fine delay section 130, is delayed more than the first fixed fine delay clock ffd_clk1 in accordance with the control of the m first coarse control signals crscnt1<1:M> and the n first fine control signals fincnt1<1:n>. The first variable fine delay clock vfd_clk1 is delayed until the first coarse state signal crsstt1 and the first fine state signal finstt1 are enabled.

Then, the logical sum operating section 160 performs a logical sum operation on the first fixed fine delay clock ffd_clk1 and the first variable fine delay clock vfd_clk1, thereby generating the first corrected clock crt_clk1. That is, if the high-level period of the input clock clk_in is narrower than the low-level period thereof, the logical sum operating section 160 performs a logical sum operation on a clock obtained by delaying the input clock clk_in by a predetermined delay time and a clock obtained by delaying the input clock clk_in by a delay time longer than the predetermined delay time, thereby generating a clock having a duty ratio of approximately 50%.

Figure 7:
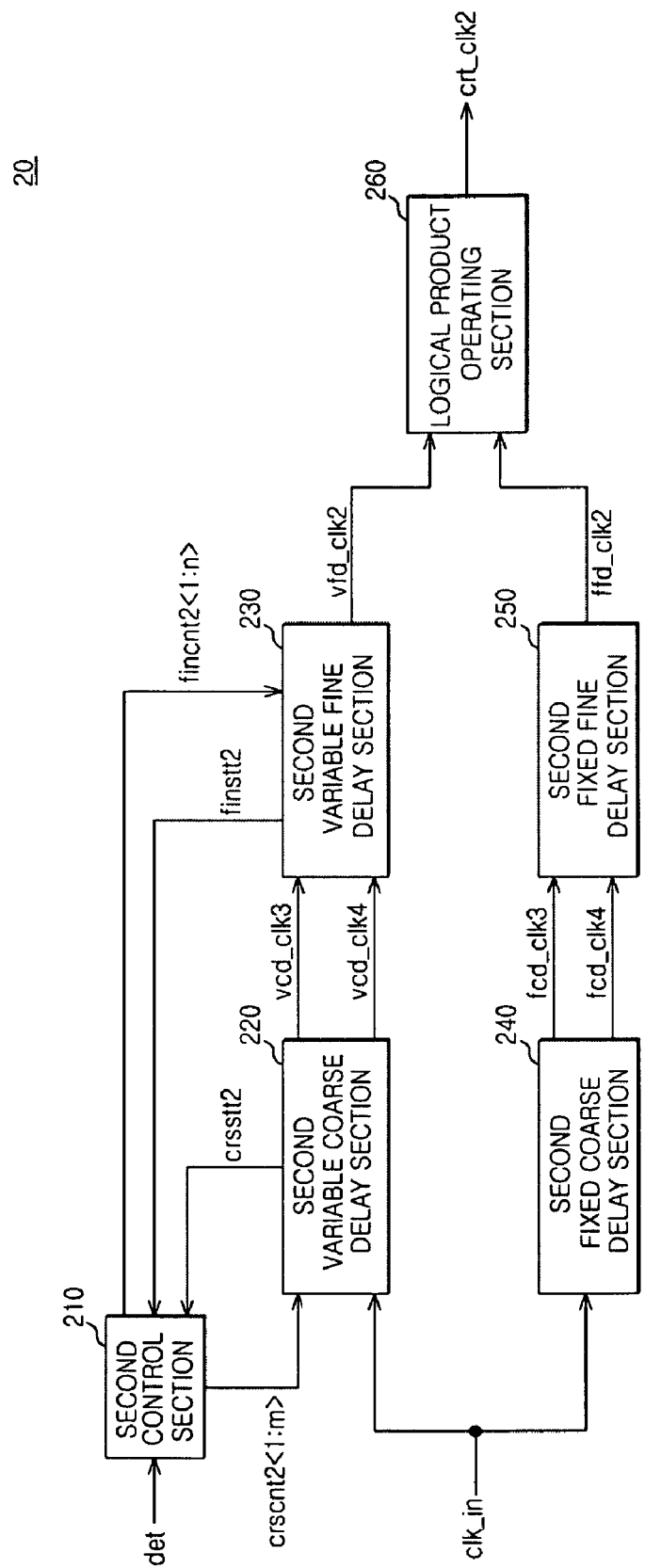
FIG. 7 is a diagram illustrating a structure of an exemplary second duty ratio correcting unit shown in FIG. 1.

Referring to FIG. 7, the exemplary second duty ratio correcting unit 20 includes a second control section 210, a second variable coarse delay section 220, a second variable fine delay section 230, a second fixed coarse delay section 240, a second fixed fine delay section 250, and a logical product operating section 260.

The second control section 210 receives the detection signal det, and generates m second coarse control signals crscnt2<1:m> and n second fine control signals fincnt2<1:n> in response to a second coarse state signal crsstt2 and a second fine state signal finstt2.

The second variable coarse delay section 220 coarsely delays the input clock clk_in to output a third variable coarse delay clock vcd_clk3 and a fourth variable coarse delay clock vcd_clk4 in response to the m second coarse control signal crscnt2<1:m>, and outputs the second coarse state signal crsstt2.

The second variable fine delay section 230 outputs the second variable fine delay clock vfd_clk2 from the third variable coarse delay clock vcd_clk3 and the fourth variable coarse delay clock vcd_clk4 in response to the n second fine control signals fincnt2<1:n>, and outputs the second fine state signal finstt2.

The second fixed coarse delay section 240 coarsely delays the input clock clk_in by a fixed time, thereby outputting a third fixed coarse delay clock fcd_clk3 and a fourth fixed coarse delay clock fcd_clk4.

The second fixed fine delay section 250 outputs the second fixed fine delay clock ffd_clk2 from the third fixed coarse delay clock fcd_clk3 and the fourth fixed coarse delay clock fcd_clk4.

The logical product operating section 260 performs a logical product operation on the second variable fine delay clock vfd_clk2 and the second fixed fine delay clock ffd_clk2, thereby outputting the second corrected clock crt_clk2.

The second control section 210, the second variable coarse delay section 220, the second variable fine delay section 230, the second fixed coarse delay section 240, and the second fixed fine delay section 250 of the second duty ratio correcting unit 20 are constructed to be similar to the first control section 110, the first variable coarse delay section 120, the first variable fine delay section 130, the first fixed coarse delay section 140, and the first fixed fine delay section 150 of the first duty ratio correcting unit 10, respectively. Meanwhile, the second duty ratio correcting unit 20 has a structure that is slightly different from that of the first duty ratio correcting unit 10. Specifically, in the second duty ratio correcting unit 20, the second variable coarse delay section 220 and the second variable fine delay section 230 generate the second variable fine delay clock vfd_clk2 whose phase is earlier than a phase of the input clock clk_in. Further, the second duty ratio correcting unit 20 includes the logical product operating section 260 that performs a logical product operation on the second variable fine delay clock vfd_clk2 and the second fixed fine delay clock ffd_clk2 to generate the second corrected clock crt_clk2.

Figure 8:
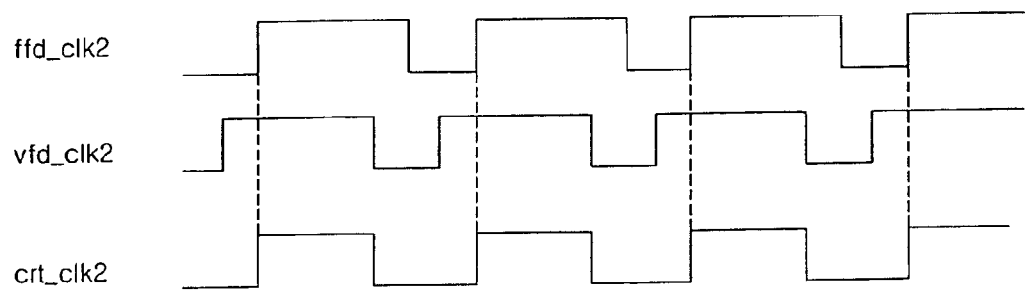
FIG. 8 is a timing diagram illustrating an example of the operation of an exemplary second duty ratio correcting unit shown in FIG. 7.

FIG. 8 shows examples of waveforms of a second fixed fine delay clock ffd_clk2, a second variable fine delay clock vfd_clk2, and a second corrected clock crt_clk2 when a second duty ratio correcting unit 20 is activated.

The second duty ratio correcting unit 20 is activated when a high-level period of the input clock clk_in is wider than a low-level period thereof. The second variable fine delay clock vfd_clk2, which is generated by the second variable coarse delay section 220 and the second variable fine delay section 230, has a phase that is earlier than a phase of the second fixed fine delay clock ffd_clk2 in accordance with the control of the m second coarse control signals crscnt2<1:m> and the n second fine control signals fincnt2<1:n>. The phase of the second variable fine delay clock vfd_clk2 is changed to be earlier than an original phase thereof until the second coarse state signal crsstt2 and the second fine state signal finstt2 are enabled.

Then, the logical product operating section 260 performs a logical product operation on the second fixed fine delay clock ffd_clk2 and the second variable fine delay clock vfd_clk2, thereby generating the second corrected clock crt_clk2. That is, if the high-level period of the input clock clk_in is wider than the low-level period thereof, the logical product operating section 260 performs a logical product operation on a clock obtained by delaying the input clock clk_in by a predetermined delay time and a clock obtained by delaying the input clock clk_in by a delay time longer than the predetermined delay time, thereby generating a clock having a duty ratio of, for example, approximately 50%.

Figure 9:
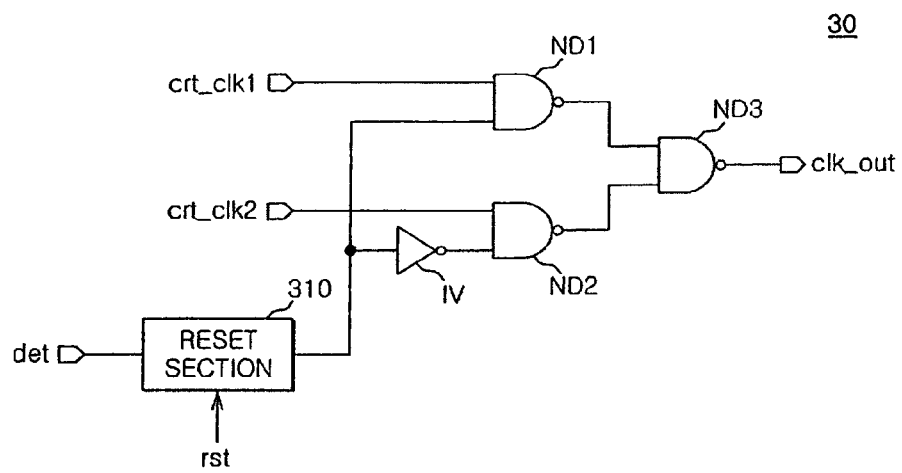
FIG. 9 is a diagram illustrating a detailed structure of an exemplary clock selecting unit shown in FIG. 1.

Referring to FIG. 9, the exemplary clock selecting unit 30 includes a reset section 310, a first NAND gate ND1, an inverter IV, a second NAND gate ND2, and a third NAND gate ND3.

The reset section 310 controls a level of the detection signal det in response to a reset signal rst.

The first NAND gate ND1 receives the first corrected clock crt_clk1 and the detection signal det transmitted by the reset section 310.

The inverter IV receives the detection signal det transmitted by the reset section 310.

The second NAND gate ND2 receives an output signal of the inverter IV and the second corrected clock crt_clk2.

The third NAND gate ND3 receives an output signal of the first NAND gate ND1 and an output signal of the second NAND gate ND2 and outputs the output clock clk_out.

In the above-described structure, if the level of the detection signal det is at a high level, the first corrected clock crt_clk1 is output as the output clock clk_out, and if the level of the detection signal det is at a low level, the second corrected clock crt_clk2 is output as the output clock clk_out.

The reset section 310 is used to change the level of the detection signal det in response to the reset signal rst. The reset signal rst can be obtained by combining, for example, any of the first coarse state signal crsstt1, the first fine state signal finstt1, the second coarse state signal crsstt2, and the second fine state signal finstt2. The reset signal rst is enabled at a timing of when the level of the detection signal det may be controlled.

Figure 10:
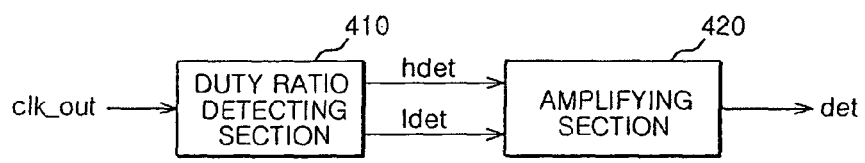
FIG. 10 is a diagram illustrating a detailed structure of an exemplary duty ratio detecting unit shown in FIG. 1.

Referring to FIG. 10, the exemplary duty ratio detecting unit 40 includes a duty ratio detecting section 410 and an amplifying section 420. The duty ratio detecting section 410 detects the duty ratio of the output clock clk_out, thereby generating a high detection signal hdet and a low detection signal ldet. The amplifying unit 420 performs a differential amplifying operation on the high detection signal hdet and the low detection signal ldet, thereby outputting the detection signal det.

The duty ratio detecting section 410 may be implemented by using, for example, a general duty accumulator. If a high-level period of the output clock clk_out is wider than a low-level period thereof, the duty ratio detecting section 410 outputs the high detection signal hdet whose level is higher than a level of the low detection signal ldet. If the high-level period of the output clock clk_out is narrower than the low-level period thereof, the duty ratio detecting section 410 outputs the low detection signal ldet whose level is higher than a level of the high detection signal hdet.

The amplifying section 420 can be implemented by, for example, a general differential amplifier. If the level of the low detection signal ldet is higher than the level of the high detection signal hdet, the amplifying section 420 outputs the detection signal det at the high level, and if the level of the high detection signal hdet is higher than the level of the low detection signal ldet, the amplifying section 420 outputs the detection signal det at the low level.

As described above, if the high-level period of the input clock is narrower than the low-level period of the input clock, the duty cycle correcting circuit delays the input clock by the predetermined delay time and performs a logical sum operation on the clock obtained by delaying the input clock and the input clock to generate the corrected clock. If the high-level period of the input clock is wider than the low-level period of the input clock, the duty cycle correcting circuit makes the phase of the input clock earlier than an original phase, and performs a logical production operation on the clock, whose phase becomes earlier than the original phase, and the input clock to generate the corrected clock. The clocks generated by the above-described processes are selectively output according to the detection result of the duty ratio on the input clock.

Accordingly, the digital-type duty cycle correcting circuit that can be implemented by the embodiments of the present invention has advantages in that it has a short operation time, a small occupied area, and small current consumption, while outputting clocks having an improved duty ratio quality.

Figure 11:
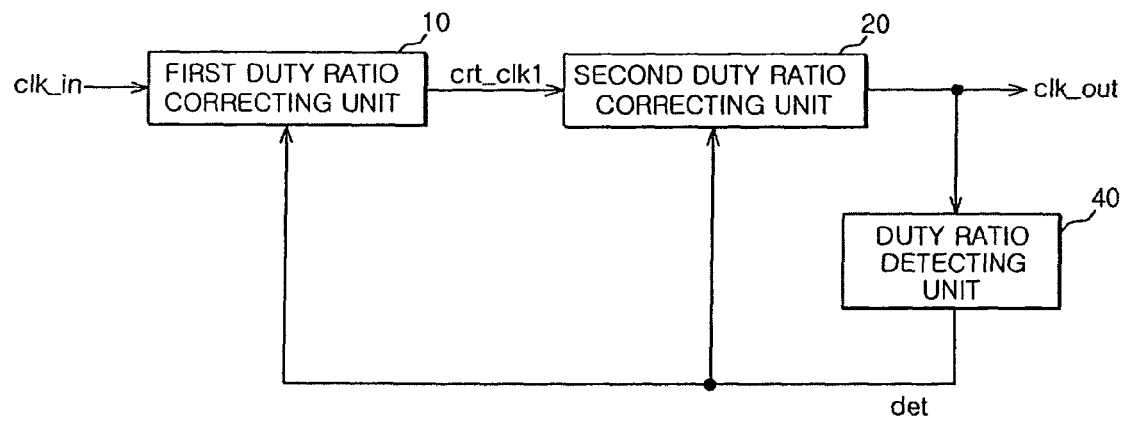
FIG. 11 is a block diagram illustrating a structure of an exemplary duty cycle correcting circuit according to another embodiment of the present invention.

Referring to FIG. 11, a an exemplary duty cycle correcting circuit according to another embodiment of the present invention includes a first duty ratio correcting unit 10 and a second duty ratio correcting unit 20 that are coupled to each other, for example, in series and a duty ratio detecting unit 40. In this case, the duty ratio detecting unit 40 detects a duty ratio of the output clock clk_out output by the second duty ratio correcting unit 20, thereby selectively activating the first duty ratio correcting unit 10 or the second duty ratio correcting unit 20.

If the high-level period of the output clock clk_out is narrower than the low-level period thereof, the duty ratio detecting unit 40 generates the detection signal det at a high level. As a result, the first duty ratio correcting unit 10 is activated, and widens the high-level period of the input clock clk_in to generate a corrected clock crt_clk whose duty ratio has been corrected. At this time, since the second duty ratio correcting unit 20 is not activated, the corrected clock crt_clk is output as the output clock clk_out.

Meanwhile, if the high-level period of the output clock clk_out is wider than the low-level period thereof, the duty ratio detecting unit 40 generates the detection signal det at a low level. As a result, the second duty ratio correcting unit 20 is activated, and narrows the high-level period of the corrected clock crt_clk to generate the output clock clk_out whose duty ratio has been corrected. At this time, since the first duty ratio correcting unit 10 is not activated, the corrected clock crt_clk is output as the input clock clk_in whose duty ratio has not been corrected.

In this embodiment, the first duty ratio correcting unit 10 is disposed in front of the second duty ratio correcting unit 20. The locations of the first duty ratio correcting unit 10 and the second duty ratio correcting unit 20 may be changed, which does not depart from the scope of the present invention.

In the duty ratio correcting circuit according to this embodiment of the present invention, since the first and second duty ratio correcting units 10 and 20 are connected in series, it is not required to use a selecting circuit for selecting the clocks output from duty ratio correcting units, which maximizes the use of device area.

It will be apparent to those skilled in the art that various modifications and changes may be made without departing from the scope and spirit of the invention. Therefore, it should be understood that the above embodiments are not limitative, but illustrative in all aspects. The scope of the invention is defined by the appended claims rather than by the description preceding them, and therefore all changes and modifications that fall within metes and bounds of the claims, or equivalents of such metes and bounds are therefore intended to be embraced by the claims.

The duty cycle correcting circuit and the duty cycle correcting method according to the embodiments of the present invention may maintain a short operation time, a small occupied area, and small current consumption, while outputting a clock having improved duty ratio quality.

What is claimed is:

1. A duty cycle correcting circuit comprising:
    a first duty ratio correcting unit configured to widen a high-level period of an input clock in response to a detection signal, thereby correcting a duty ratio of the input clock to output a corrected clock;
    a second duty ratio correcting unit configured to narrow a high-level period of the corrected clock in response to the detection signal, thereby correcting a duty ratio of the corrected clock to output an output clock; and
    a duty ratio detecting unit configured to detect a duty ratio of the output clock, thereby generating the detection signal.

2. The duty cycle correcting circuit of claim 1,
    wherein the first duty ratio correcting unit is configured to delay the input clock to generate a fixed fine delay clock and a variable fine delay clock, and to perform a logical sum operation on the fixed fine delay clock and the variable fine delay clock to generate the corrected clock.

3. The duty cycle correcting circuit of claim 2,
    wherein the first duty ratio correcting unit comprises:
    a control section configured to receive the detection signal and to generate a coarse control signal and a plurality of fine control signals in response to a coarse state signal and a fine state signal;
    a variable coarse delay section configured to coarsely delay the input clock to output a first variable coarse delay clock and a second variable coarse delay clock in response to the coarse control signal, and to output the coarse state signal;
    a variable fine delay section configured to output the variable fine delay clock from the first variable coarse delay clock and the second variable coarse delay clock in response to the plurality of fine control signals, and to output the fine state signal;
    a fixed coarse delay section configured to coarsely delay the input clock by a fixed time, thereby outputting a first fixed coarse delay clock and a second fixed coarse delay clock;
    a fixed fine delay section configured to output the fixed fine delay clock from the first fixed coarse delay clock and the second fixed coarse delay clock; and
    a logical sum operating section configured to perform a logical sum operation on the variable fine delay clock and the fixed fine delay clock to output the corrected clock.

4. The duty cycle correcting circuit of claim 3,
    wherein the control section comprises:
    a coarse control section configured to generate a coarse delay completion signal and the coarse control signal in response to the detection signal and the coarse state signal;

a fine control section configured to generate a count enable signal in response to the detection signal, the coarse delay completion signal, and the fine state signal; and a fine counter configured to generate the plurality of fine control signals in response to the count enable signal.

5. The duty cycle correcting circuit of claim 3, wherein the variable coarse delay section comprises:

a first unit delay section configured to delay the input clock in response to a plurality of first unit delay control signals to output the first variable coarse delay clock;

a second unit delay section configured to delay the input clock in response to a plurality of second unit delay control signals to output the second variable coarse delay clock; and a unit delay control section configured to enable one of the plurality of first unit delay control signals and one of the plurality of second unit delay control signals in response to the coarse control signal.

6. The duty cycle correcting circuit of claim 5, wherein one of the plurality of first unit delay control signals and the plurality of second unit delay control signals is output as the coarse state signal.

7. The duty cycle correcting circuit of claim 3, wherein the variable fine delay section comprises:

a first driving section configured to drive the first variable coarse delay clock in response to the plurality of fine control signals to obtain a driven first variable coarse delay clock and to transmit the driven first variable coarse delay clock to a first node;

a second driving section configured to drive the second variable coarse delay clock in response to inverted signals of the plurality of fine control signals to obtain a driven second variable coarse delay clock and to transmit the driven second variable coarse delay clock to the first node; and a third driving section configured to drive a signal formed at the first node, thereby outputting the variable fine delay clock.

8. The duty cycle correcting circuit of claim 7, wherein each of the first driving section and the second driving section comprises a plurality of drivers providing a respective output signal, and one of the output signals of the plurality of drivers is output as the fine state signal.

9. The duty cycle correcting circuit of claim 1, wherein the second duty ratio correcting unit is configured to delay the corrected clock to generate a fixed fine delay clock and a variable fine delay clock, and to perform a logical product operation on the fixed fine delay clock and the variable fine delay clock to generate the output clock.

10. The duty cycle correcting circuit of claim 9, wherein the second duty ratio correcting unit comprises:

a control section configured to receive the detection signal and to generate a coarse control signal and a plurality of fine control signals in response to a coarse state signal and a fine state signal;

a variable coarse delay section configured to coarsely delay the corrected clock to output a first variable coarse delay clock and a second variable coarse delay clock in response to the coarse control signal, and to output the coarse state signal;

a variable fine delay section configured to output the variable fine delay clock from the first variable coarse delay clock and the second variable coarse delay clock in response to the plurality of fine control signals, and to output the fine state signal;

a fixed coarse delay section configured to coarsely delay the corrected clock by a fixed time, thereby outputting a first fixed coarse delay clock and a second fixed coarse delay clock;

a fixed fine delay section configured to output the fixed fine delay clock from the first fixed coarse delay clock and the second fixed coarse delay clock; and a logical product operating section configured to perform a logical product operation on the variable fine delay clock and the fixed fine delay clock to output the output clock.

11. The duty cycle correcting circuit of claim 10, wherein the control section comprises:

a coarse control section configured to generate a coarse delay completion signal and the coarse control signal in response to the detection signal and the coarse state signal;

a fine control section configured to generate a count enable signal in response to the detection signal, the coarse delay completion signal, and the fine state signal; and a fine counter configured to generate the plurality of fine control signals in response to the count enable signal.

12. The duty cycle correcting circuit of claim 10, wherein the variable coarse delay section comprises:

a first unit delay section configured to delay the corrected clock in response to a plurality of first unit delay control signals, thereby outputting the first variable coarse delay clock;

a second unit delay section configured to delay the corrected clock in response to a plurality of second unit delay control signals, thereby outputting the second variable coarse delay clock; and a unit delay control section configured to enable one of the plurality of first unit delay control signals and one of the plurality of second unit delay control signals in response to the coarse control signal.

13. The duty cycle correcting circuit of claim 12, wherein one of the plurality of first unit delay control signals and the plurality of second unit delay control signals is output as the coarse state signal.

14. The duty cycle correcting circuit of claim 10, wherein the variable fine delay section comprises:

a first driving section configured to drive the first variable coarse delay clock in response to the plurality of fine control signals to obtain a driven first variable coarse delay clock and to transmit the driven first variable coarse delay clock to a first node;

a second driving section configured to drive the second variable coarse delay clock in response to inverted signals of the plurality of fine control signals to obtain a driven second variable coarse delay clock and to transmit the driven second variable coarse delay clock to the first node; and a third driving section configured to drive a signal formed at the first node, thereby outputting the variable fine delay clock.

15. The duty cycle correcting circuit of claim 14, wherein each of the first driving section and the second driving section comprises a plurality of drivers providing respective output signals, and one of the output signals of the plurality of drivers is output as the fine state signal.

16. The duty cycle correcting circuit of claim 1, wherein the duty ratio detecting unit comprises:

a duty ratio detecting section configured to detect the duty ratio of the output clock, thereby generating a high detection signal and a low detection signal; and an amplifying section configured to perform a differential amplifying operation on the high detection signal and the low detection signal, thereby outputting the detection signal.

17. A duty cycle correcting circuit comprising:
a first duty ratio correcting unit configured to narrow a high-level period of an input clock in response to a detection signal, thereby correcting a duty ratio of the input clock to output a corrected clock;
a second duty ratio correcting unit configured to widen a high-level period of the corrected clock in response to the detection signal, thereby correcting a duty ratio of the corrected clock to output an output clock; and
a duty ratio detecting unit configured to detect a duty ratio of the output clock, thereby generating the detection signal.

18. The duty cycle correcting circuit of claim 17, wherein the first duty ratio correcting unit is configured to delay the input clock to generate a fixed fine delay clock and a variable fine delay clock, and to perform a logical product operation on the fixed fine delay clock and the variable fine delay clock to generate the corrected clock.

19. The duty cycle correcting circuit of claim 18, wherein the first duty ratio correcting unit comprises:
a control section configured to receive the detection signal and to generate a coarse control signal and a plurality of fine control signals in response to a coarse state signal and a fine state signal;
a variable coarse delay section configured to coarsely delay the input clock so as to output a first variable coarse delay clock and a second variable coarse delay clock in response to the coarse control signal, and to output the coarse state signal;
a variable fine delay section configured to output the variable fine delay clock from the first variable coarse delay clock and the second variable coarse delay clock in response to the plurality of fine control signals, and to output the fine state signal;
a fixed coarse delay section configured to coarsely delay the input clock by a fixed time, thereby outputting a first fixed coarse delay clock and a second fixed coarse delay clock;
a fixed fine delay section configured to output the fixed fine delay clock from the first fixed coarse delay clock and the second fixed coarse delay clock; and
a logical product operating section configured to perform a logical product operation on the variable fine delay clock and the fixed fine delay clock to output the corrected clock.

20. The duty cycle correcting circuit of claim 19, wherein the control section comprises:
a coarse control section configured to generate a coarse delay completion signal and the coarse control signal in response to the detection signal and the coarse state signal;
a fine control section configured to generate a count enable signal in response to the detection signal, the coarse delay completion signal, and the fine state signal; and
a fine counter configured to generate the plurality of fine control signals in response to the count enable signal.

21. The duty cycle correcting circuit of claim 19, wherein the variable coarse delay section comprises:
a first unit delay section configured to delay the input clock in response to a plurality of first unit delay control signals, thereby outputting the first variable coarse delay clock;
a second unit delay section configured to delay the input clock in response to a plurality of second unit delay control signals, thereby outputting the second variable coarse delay clock; and
a unit delay control section configured to enable one of the plurality of first unit delay control signals and one of the plurality of second unit delay control signals in response to the coarse control signal.

22. The duty cycle correcting circuit of claim 21, wherein one of the plurality of first unit delay control signals and the plurality of second unit delay control signals is output as the coarse state signal.

23. The duty cycle correcting circuit of claim 19, wherein the variable fine delay section comprises:
a first driving section configured to drive the first variable coarse delay clock in response to the plurality of fine control signals to obtain a driven first variable coarse delay clock and to transmit the driven first variable coarse delay clock to a first node;
a second driving section configured to drive the second variable coarse delay clock in response to inverted signals of the plurality of fine control signals to obtain a driven second variable coarse delay clock and to transmit the driven second variable coarse delay clock to the first node; and
a third driving section configured to drive a signal formed at the first node, thereby outputting the variable fine delay clock.

24. The duty cycle correcting circuit of claim 23, wherein each of the first driving section and the second driving section comprises a plurality of drivers providing respective output signals, and
one of the output signals of the plurality of drivers is output as the fine state signal.

25. The duty cycle correcting circuit of claim 17, wherein the second duty ratio correcting unit is configured to delay the corrected clock to generate a fixed fine delay clock and a variable fine delay clock, and to perform a logical sum operation on the fixed fine delay clock and the variable fine delay clock to generate the output clock.

26. The duty cycle correcting circuit of claim 25, wherein the second duty ratio correcting unit comprises:
a control section configured to receive the detection signal and to generate a coarse control signal and a plurality of fine control signals in response to a coarse state signal and a fine state signal;
a variable coarse delay section configured to coarsely delay the corrected clock to output a first variable coarse delay clock and a second variable coarse delay clock in response to the coarse control signal, and to output the coarse state signal;
a variable fine delay section configured to output the variable fine delay clock from the first variable coarse delay clock and the second variable coarse delay clock in response to the plurality of fine control signals, and to output the fine state signal;
a fixed coarse delay section configured to coarsely delay the corrected clock by a fixed time, thereby outputting a first fixed coarse delay clock and a second fixed coarse delay clock;
a fixed fine delay section configured to output the fixed fine delay clock from the first fixed coarse delay clock and the second fixed coarse delay clock; and
a logical sum operating section configured to perform a logical sum operation on the variable fine delay clock and the fixed fine delay clock to output the output clock.

27. The duty cycle correcting circuit of claim 26, wherein the control section comprises:

a coarse control section configured to generate a coarse delay completion signal and the coarse control signal in response to the detection signal and the coarse state signal;

a fine control section configured to generate a count enable signal in response to the detection signal, the coarse delay completion signal, and the fine state signal; and a fine counter configured to generate the plurality of fine control signals in response to the count enable signal.

28. The duty cycle correcting circuit of claim 26, wherein the variable coarse delay section comprises:

a first unit delay section configured to delay the corrected clock in response to a plurality of first unit delay control signals, thereby outputting the first variable coarse delay clock;

a second unit delay section configured to delay the corrected clock in response to a plurality of second unit delay control signals, thereby outputting the second variable coarse delay clock; and a unit delay control section configured to enable one of the plurality of first unit delay control signals and one of the plurality of second unit delay control signals in response to the coarse control signal.

29. The duty cycle correcting circuit of claim 28, wherein one of the plurality of first unit delay control signals and the plurality of second unit delay control signals is output as the coarse state signal.

30. The duty cycle correcting circuit of claim 26, wherein the variable fine delay section comprises:

a first driving section configured to drive the first variable coarse delay clock in response to the plurality of fine control signals to obtain a driven first variable coarse delay clock and to transmit the driven first variable coarse delay clock to a first node;

a second driving section configured to drive the second variable coarse delay clock in response to inverted signals of the plurality of fine control signals to obtain a second variable coarse delay clock and to transmit the driven second variable coarse delay clock to the first node; and a third driving section configured to drive a signal formed at the first node, thereby outputting the variable fine delay clock.

31. The duty cycle correcting circuit of claim 30, wherein each of the first driving section and the second driving section comprises a plurality of drivers providing respective output signals, and one of the output signals of the plurality of drivers is output as the fine state signal.

32. The duty cycle correcting circuit of claim 17, wherein the duty ratio detecting unit comprises:

a duty ratio detecting section configured to detect the duty ratio of the output clock, thereby generating a high detection signal and a low detection signal; and an amplifying section configured to perform a differential amplifying operation on the high detection signal and the low detection signal, thereby outputting the detection signal.

* * * * *